United States Patent [19]
Fraas

[11] Patent Number: 5,551,992
[45] Date of Patent: Sep. 3, 1996

[54] THERMOPHOTOVOLTAIC GENERATOR WITH LOW BANDGAP CELLS AND HYDROCARBON BURNER

[75] Inventor: Lewis M. Fraas, Issaquah, Wash.

[73] Assignee: JX Crystals Inc., Issaquah, Wash.

[21] Appl. No.: 437,875

[22] Filed: May 9, 1995

Related U.S. Application Data

[63] Continuation-in-part of Ser. No. 393,919, Feb. 24, 1995, which is a continuation-in-part of Ser. No. 260,910, Jun. 15, 1994, Pat. No. 5,439,532, which is a continuation-in-part of Ser. No. 47,477, Apr. 19, 1993, Pat. No. 5,383,976, which is a continuation-in-part of Ser. No. 906,452, Jun. 30, 1992, Pat. No. 5,312,521.

[51] Int. Cl.$^6$ .................................................. H01L 31/058
[52] U.S. Cl. ........................................................... 136/253
[58] Field of Search ............................................... 136/253

[56] References Cited

U.S. PATENT DOCUMENTS

| | | | |
|---|---|---|---|
| 5,312,521 | 5/1994 | Fraas et al. | 136/253 |
| 5,356,487 | 10/1994 | Goldstein et al. | 136/253 |
| 5,383,976 | 1/1995 | Fraas et al. | 136/253 |
| 5,439,532 | 8/1995 | Fraas | 136/253 |

*Primary Examiner*—Aaron Weisstuch
*Attorney, Agent, or Firm*—James Creighton Wray

[57] ABSTRACT

A thermophotovoltaic generator includes a stainless steel heat exchanger, a ceramic heat exchanger, a mixing chamber, a combustion chamber, an igniter, an infrared radiation emitter with counterflow, and an array of thermophotovoltaic cells surrounding the emitter and tube. The generator possesses both high conductance for the combustion gases and efficient heat transfer from the hot combustion gases to the emitter. The thermophotovoltaic cells have an IR response at least out to 1.7 microns and are fitted with simple dielectric filters. The emitter is an SiC spine disc emitter that is surrounded by at least one fused silica heat shield. Preferably, the thermophotovoltaic cells are GaSb cells, the infrared radiation emitter is a SiC blackbody emitter, and the dielectric filter is designed to transmit for wavelengths less than 1.7 microns and to reflect wavelengths between 1.7 and 4.0 microns. The filter can transmit again beyond 4.0 microns where the fused silica heat shields have suppressed the emitted energy.

35 Claims, 4 Drawing Sheets

5,551,992

THERMOPHOTOVOLTAIC GENERATOR WITH LOW BANDGAP CELLS AND HYDROCARBON BURNER

BACKGROUND OF THE INVENTION

This is a continuation-in-part of patent application Ser. No. 08/393,919 filed Feb. 24, 1995, which was a continuation-in-part of patent application Ser. No. 08/260,910 filed Jun. 15, 1994, now U.S. Pat. No. 5,439,532 which was a continuation-in-part of patent application Ser. No. 08/047,477 filed Apr. 19, 1993, now U.S. Pat. No. 5,383,976, which was a continuation-in-part of patent application Ser. No. 07/906,452 filed Jun. 30, 1992, now U.S. Pat. No. 5,312,521. These earlier applications and their listed references are incorporated herein by reference.

SUMMARY OF THE INVENTION

U.S. patent application Ser. No. 07/906,452, now U.S. Pat. No. 5,312,521, and continuation-in-part U.S. patent application Ser. No. 08/047,477, now U.S. Pat. No. 5,383,976, describe a small quiet natural gas fired TPV generator using GaSb cells. These two applications describe a TPV generator in which multiple low bandgap photovoltaic cell strings are mounted around the perimeter of a cylinder parallel to a central cylindrical emitter, or IR radiator. The cell strings face radially inward to receive IR radiation from the emitter and efficiently convert this radiation into electric power. Short pass IR filters are located between the emitter and the cells to pass the useful shorter wavelength IR on to the cells while reflecting the longer wavelength IR back to the emitter. A regenerator is located at the top of the burner/emitter so that the exhaust gases preheat the supply air allowing for a higher flame temperature thereby making more short wavelength IR available to the photovoltaic cells.

The emitter in the above cylindrical TPV generator is designed to operate at between 1700° and 2000° K. and at this temperature, both the burner and emitter must be fabricated using ceramics, not metals. Although it is possible to design a ceramic emitter/burner with a uniform emitter temperature along its length by using small flame jets from a central burner tube with the jet pattern tailored for staged fuel addition as was described in these earlier applications, a problem with the flame jet design is the need for substantial combustion gas supply pressure to force fuel and air through the small jet orifices. There is a need for a burner design with high conductance and small pressure drop.

patent application Ser. No. 08/260,910 filed Jun. 15, 1994 (now U.S. Pat. No. 5,439,532) described a high conductance, small pressure drop burner geometry in which air and fuel are mixed and burned inside an emitter tube above an infrared (IR) emitter zone. The hot combustion gases then flow downward inside the emitter tube through the IR emitter zone to the emitter tube open bottom end and thence upward again through the IR emitter zone outside the emitter tube heating the emitter uniformly through a double pass. Uniform emitter temperature from the top to the bottom of the IR emitter zone is obtained because the higher heat loss at the upper end in the down pass is counterbalanced by lower heat loss at the upper end in the upward pass. However, a problem with this simple emitter tube design is insufficient heat transfer from the hot gases to the emitter because of insufficient gas contact area and insufficient gas turbulence.

Herein, we describe an improved cast ceramic spine disc burner/emitter/regenerator possessing both high conductance for the combustion gases and efficient heat transfer from the hot combustion gases to the emitter. The discs that form the ceramic heat exchanger and the emitter are arranged in columns, similar in orientation to the human spine.

All of the above earlier patent applications describe the use of a short pass filter located between the thermophotovoltaic cells and the IR emitter to transmit useful short wavelength IR energy to the cells while reflecting back longer wavelength nonuseful IR to the emitter. U.S. Pat. No. 5,403,405 authored by the present inventor describes specific short pass filters which are designed to have high reflectivity for all longer wavelengths.

patent application Ser. No. 08/393,919 filed Feb. 24, 1995 described an emitter surrounded by two larger diameter fused silica tubes with the inner fused silica tube confining the exhaust gases and the outer fused silica tube serving as a convection barrier. In the present invention, we note that fused silica tubes surrounding the emitter act as heat shields and suppress the emission of energy for wavelengths beyond 3.5 microns so that a simple dielectric filter can be very effective. Specifically in the case that the thermophotovoltaic cells are GaSb cells and the IR emitter is a SiC blackbody emitter, the dielectric filter can be designed to transmit wavelengths less than 1.7 microns and to reflect wavelengths between 1.7 and 4.0 microns. The IR filter can transmit again beyond 4.0 microns where the fused silica heat shields have suppressed the emitted energy.

These and further and other objects and features of the invention are apparent in the disclosure, which includes the above and ongoing written specification, with the claims and the drawings.

DETAILED DESCRIPTION OF THE PREFERRED EMBODIMENTS

Figure 1:
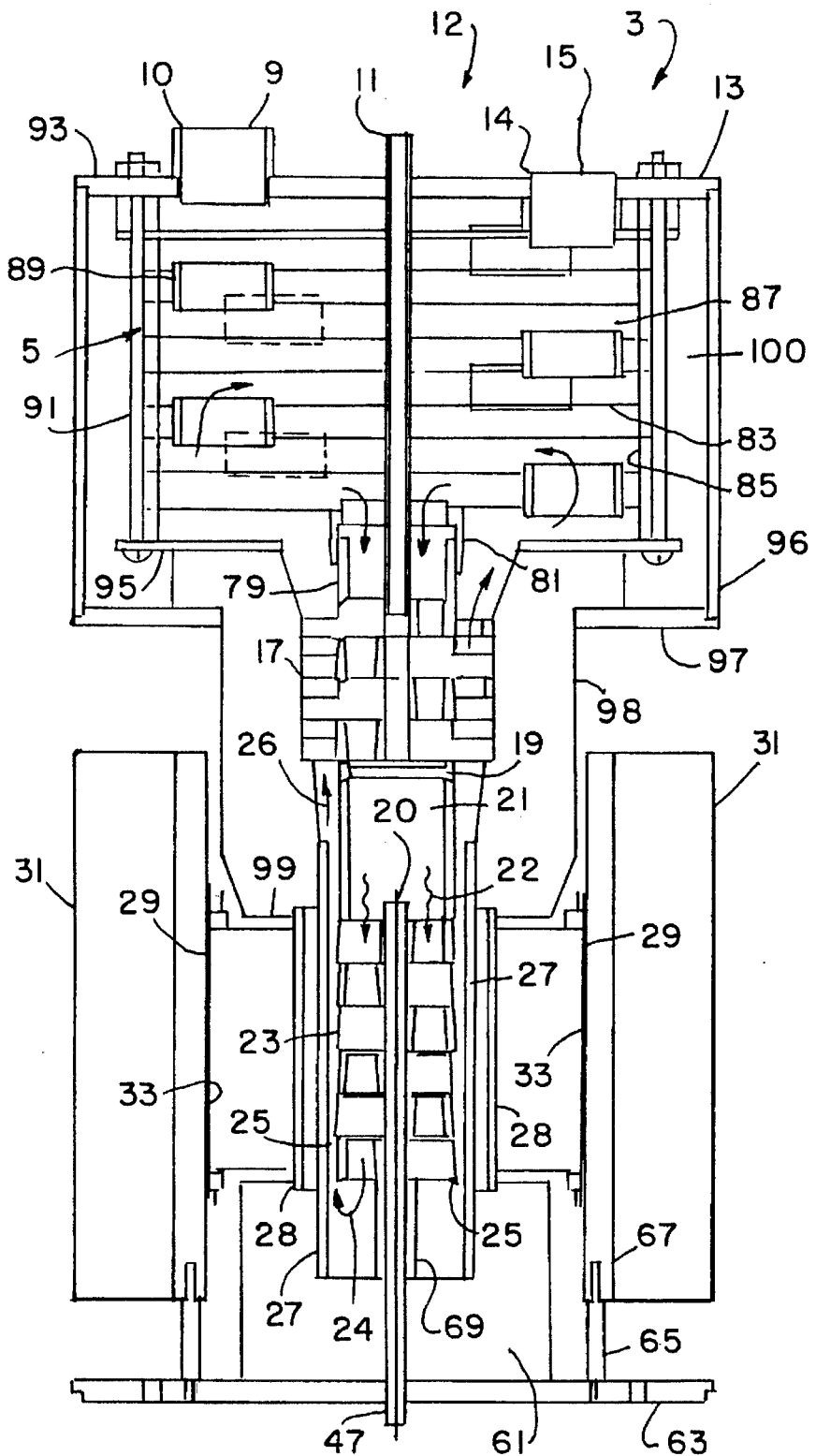
FIG. 1 schematically shows the thermophotovoltaic generator of the present invention in cross-sectional side elevation.

FIG. 1 shows a vertical cross section through the thermophotovoltaic generator cylinder 3 of the present invention. Although this figure shows the generator cylinder 3 with the heat exchangers 5 and 17 at the top and the IR emitter 23 at the bottom, it should be noted that the generator can operate effectively in any orientation. However in the following for purposes of clarity, we will describe the relative positions of all the key parts given the orientation shown in this figure.

Combustion supply air 9 and fuel 11 are supplied through an inlet 10 and fuel tube 12 at the top 13 of the cylinder 3. Exhaust gases 15 exit through exhaust port 14 at the top 13. The supply air 9 meanders through a stainless steel heat exchanger 5 where it is preheated by the counterflow exhaust gas 15. The temperatures of both the supply air 9 and the exhaust gas 15 at the lower end of the heat exchanger 5 are close to 800° C. but below 900° C. in order to avoid extensive oxidation of the stainless steel heat exchanger plates. The preheated air then passes downward through a second SiC ceramic spine disc heat exchanger 17 where it is heated still more. Fuel 11 is supplied through fuel tube 12 from the top 13 directly through both heat exchangers 5, 17. The fuel and preheated air are then mixed in a mixing chamber 19 at the lower end of the ceramic heat exchanger 17 and thence enter a combustion chamber 21. An igniter 20 ignites the fuel-air mixture to start combustion. As chemical energy is added through combustion, the combustion gases 22 are heated to well over 1400° C. These hot gases then meander downward through a SiC spine disc IR emitter section 23, efficiently heating the emitter 23 to at least 1400° C. The hot gases 24 then return upward outside the emitter spine discs 25, heating them in a second upward pass. Thence, the exhaust gases 26 are cooled from approximately 1400° C. to approximately 900° C. in the upward pass percolating through the ceramic heat exchanger 17 into the stainless steel heat exchanger 5.

The exhaust gases 26 on the upward pass by the emitter spine discs 25 are confined by a cylindrical tube 27 which can be either a transparent fused silica or alumina tube or a SiC emitter tube. A second tube 28 of fused silica is employed. In any case, the emitter 23 is surrounded by at least one fused silica tube 28. Thermophotovoltaic cell circuits 29 surround the IR emitter 23 and receive a fraction of the emitted IR and convert it to DC electric power. These circuits 29 can be either liquid cooled or air cooled through cooling fins 31 as shown. In the preferred embodiment, IR filters 33 are bonded directly to the cells 29.

Figure 2:
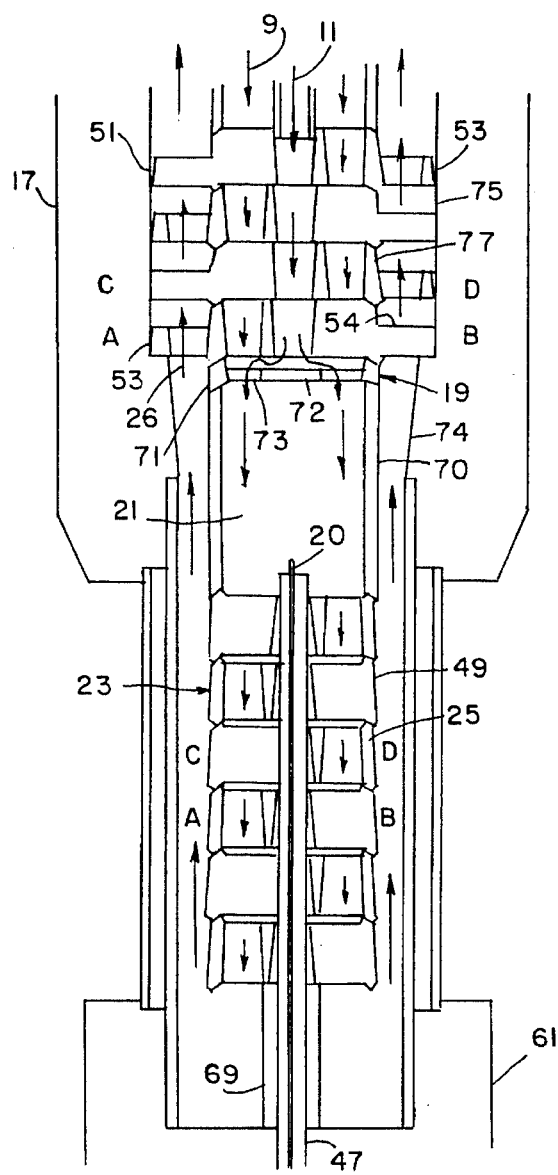
FIG. 2 schematically shows the burner/emitter/regenerator of the present invention in cross-sectional side elevation.
Figure 4:
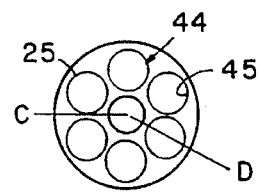
FIG. 4 is a plan view of a spine disc taken along the C-D section in a lower part of FIG. 2.
Figure 3:
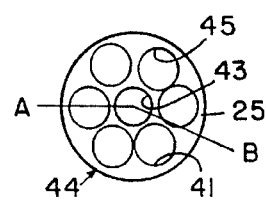
FIG. 3 is a plan view of a spine disc taken along the A-B section in a lower part of FIG. 2.

FIG. 2 shows the ceramic burner/emitter/regenerator sections in more detail. Note that the emitter section 23 consists of identical SiC spine discs 25. In the present embodiment as shown in FIGS. 2–4, the SiC emitter spine discs 25 each contain seven holes 41 with one central hole 43 surrounded by a hexagonal array 44 of six holes 45. The emitter 23 is made up by stacking or nesting several discs 25 together. The center hole 43 allows the insertion of an igniter insulator tube 47 into the combustion chamber 21 and also serves to center the discs 25. When each disc is rotated 30 degrees relative to adjacent top and bottom discs as indicated in the A-B and C-D sections of FIG. 2 as shown in FIGS. 3 and 4, the hot gas is forced to percolate back and forth through the hexagonal hole array 44 as the gas traverses the column 49 which forms the emitter 23, efficiently transferring energy to the emitter 23. Although FIGS. 2–6 and 9 show a 30 degree relative rotation from disc to disc, the relative rotation can be varied from this amount through the column in order to optimize the IR intensity uniformity along the length of the thermophotovoltaic (TPV) receivers.

Figure 6:
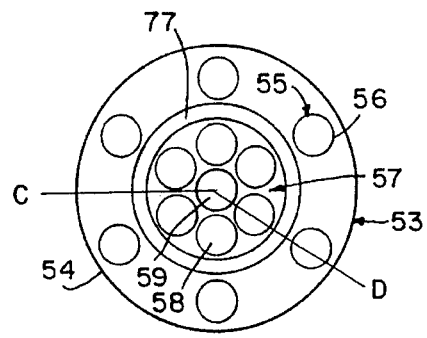
FIG. 6 is a cross-sectional illustration taken along the C-D section in an upper part of FIG. 2.
Figure 5:
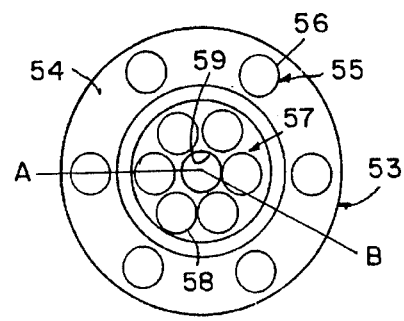
FIG. 5 is a cross-sectional illustration taken along the A-B section in an upper part of FIG. 2.

FIG. 2 also shows the spine disc heat exchanger 17. As shown in FIGS. 2, 5, and 6, a column 51 of four discs 53 are stacked. These heat exchanger discs 53 are cup-shaped and have outward extending flanges 54, an outer axial wall and an additional array 55 of six holes 56 on a larger diameter The second outer arrays 55 of holes force the exhaust gases 26 to percolate on the up pass, thence transferring energy to the supply air 9 passing downward through the inner arrays 57 of holes 58 in these discs 53. Fuel 11 is fed through the center holes 59.

As shown in the drawings the system 3 is supported on a base 61 and plate 63. Connectors 65 support the cylindrical assembly 67, which in turn holds the cooling fins 31 and the TPV circuit 29 with the integral filter 33. Base 61 surrounds the igniter insulator tube 47 and a post 69 which surrounds tube 47 and holds the column 49 of discs 25 which form the emitter 23. Base 61 also supports tubes 27 and 28. The combustion chamber 21 is formed with a rigid cylindrical wall 70 which mates with the uppermost emitter disc 25 and with a short cylindrical wall 71 of mixing chamber 19. Mixing chamber 19 has a plate 72 with openings having a wall 73 through which openings an air-fuel mixture passes. Wall 73 mates with the lowermost heat exchanger;disc 53. Expanding conical wall 74 and cylindrical wall 75 entrap exhaust gases 26, channeling them to pass along flanges 54 and through offset staggered holes 56 of discs 53. The exhaust gases 26 thereby heat the flanges 54 and the sloping walls 77 of discs 53 for transferring heat to supply air 9 meandering through angularly offset staggered holes 58 in the heat exchanger discs.

As shown in FIGS. 1 and 2 the discs 25 and 53 and the combustion and mixing chamber cylindrical walls 70 and 71 have chamfered upper edges and complementary sloped, recessed lower edges to join the elements in mutually supporting and gas sealing manners.

As shown in FIG. 1, the low temperature heat exchanger 5 is supported on a stub cylinder 79 in turn supported on the upper chamfered edge of the uppermost heat exchanger disc 53. The upper end of the stub cylinder 79 is connected to a central fixture 81 with central opening through which heated supply air 9 passes.

The heat exchanger 5 is formed of plural spaced plates 83 separated by cylindrical spacers 85. Interspaces 87 between the plates 83 are alternately interconnected by angularly offset tubes 89 to provide separation of supply air and exhaust gases. The entire stacked plate and spacer assembly is held together by bolts 91 which interconnect outer plate 93 and inner plate 95. Cylindrical and radial walls 96, 97, 98, and 99 interconnect the outer plate 93 and the outer emitter tube 28, forming an insulating chamber 100 surrounding the exhaust chambers and the heat exchangers.

Figure 7:
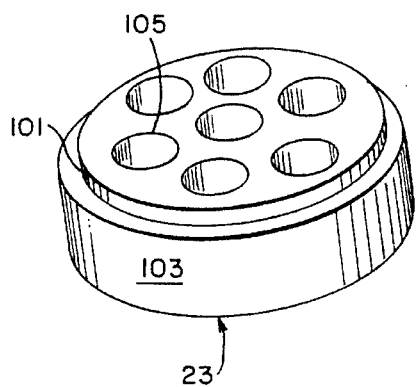
FIGS. 7, 8, and 9 show perspective views of sample SiC spine discs used to fabricate a burner of the present invention.
Figure 8:
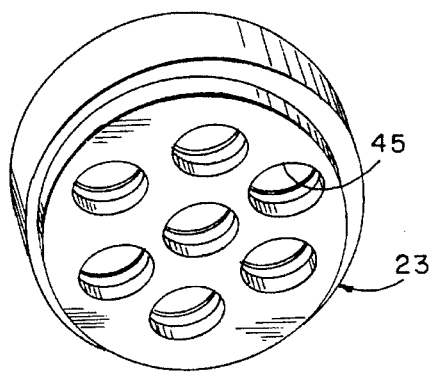
Figure 9:
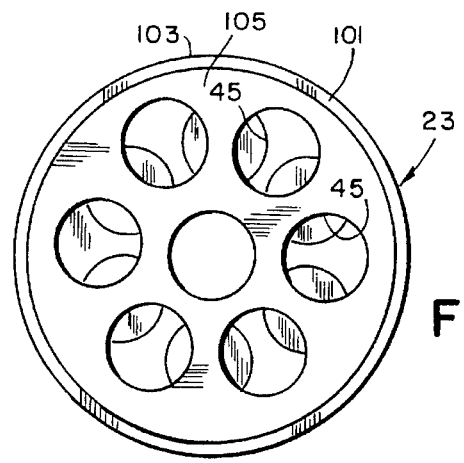

FIGS. 7 and 8 show SiC emitter spine discs 25. FIG. 9 shows a two element spine disc column 49 with holes. The discs 25 are cup shaped as shown in FIGS. 1, 2 and 7–9 with walls 103 and plates 105 in which holes are formed. As shown in FIGS. 7–9 the discs 25 have peripheral interfitting steps 101 instead of the chamfers shown in FIGS. 1 and 2. Steps 101 receive cylindrical projections in opposite ends of the discs 25.

In a preferred embodiment, GaSb cells are used along with a SiC emitter operating in the 1700° K. to 2000° K. temperature range. GaSb cells are sensitive to IR energy for wavelengths less than approximately 1.7 microns and SiC is a near blackbody emitter. As a blackbody, SiC emits energy at all wavelengths. However, when a SiC emitter is surrounded by fused silica, it is convenient to divide the spectrum into three parts, i.e. wavelengths less than 1.7 microns, wavelengths between 1.7 and 4 microns, and wavelengths longer than 4 microns.

Since fused silica absorbs wavelengths longer than 4 microns and reradiates the absorbed energy in both directions, a single fused silica tube surrounding an SiC emitter will act as a heat shield returning half of the absorbed energy beyond 4 microns back to the emitter. More generally for N silica heat shields, the energy radiated beyond 4 microns can be reduced by 1/(N+1). In other words, the combination of SiC emitter surrounded by N fused silica heat shields acts as a selective emitter with a high emissivity for wavelengths less than 4 microns but with a low emissivity for wavelengths longer than 4 microns. For the case of two silica tubes as shown in FIG. 1, one confining the exhaust gases and a second serving as a convection barrier, the effective emissivity is over 75% for wavelengths less than 4 microns and less than 33% for longer wavelengths. We have confirmed this fact by spectral measurements of the energy from a hot SiC/fused silica selective emitter.

Figure 10:
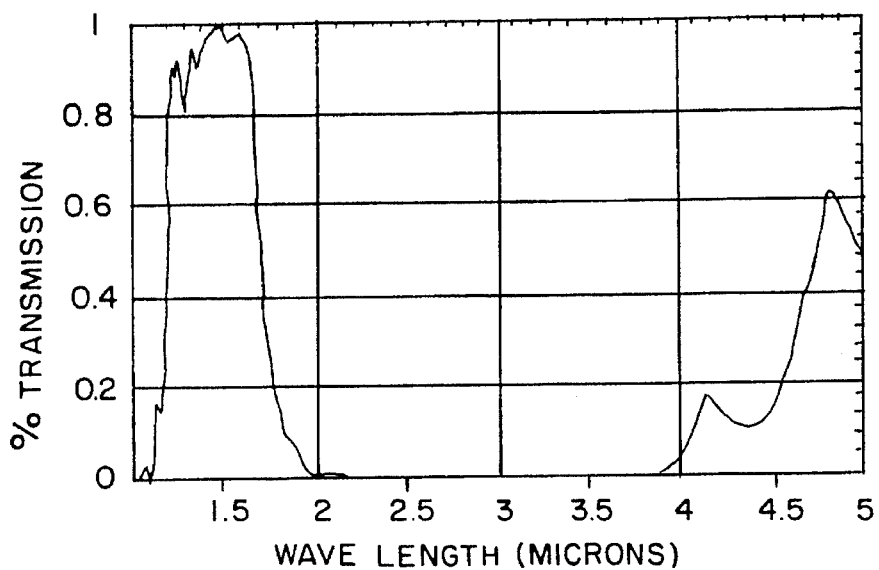
FIG. 10 shows the IR transmission spectra through a 17 layer dielectric filter designed for use with GaSb TPV cells.

Referring now to the IR transmission curve shown in FIG. 10, a multiple layer dielectric filter can be designed using alternating high and low index materials. This filter transmits energy below 1.7 microns to the GaSb cells and reflects the energy between 1.7 microns and 4 microns very efficiently back to the emitter.

Figure 11:
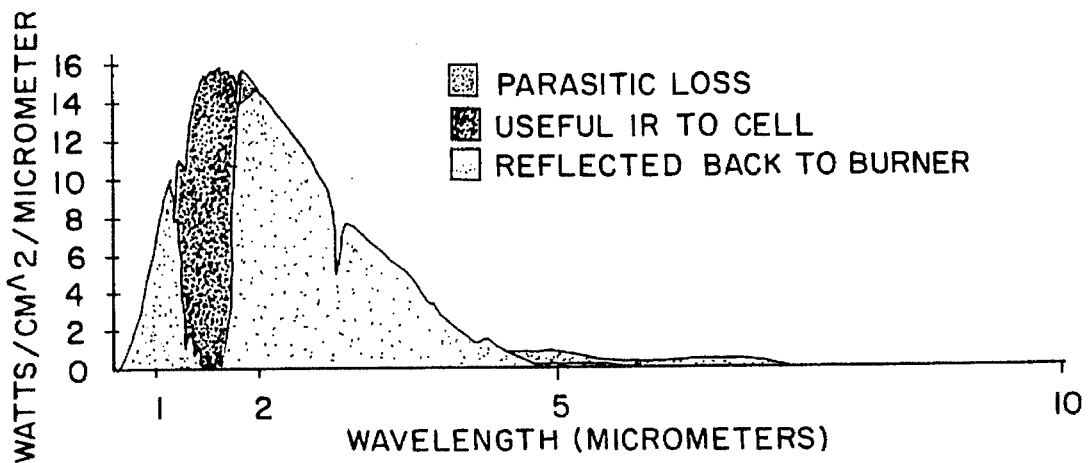
FIG. 11 shows the energy partition for a thermophotovoltaic generator using GaSb cells, the IR dielectric filter of FIG. 10, and a SiC emitter surrounded by two fused silica heat shields.

The filter of FIG. 10 works very well with a selective SiC/fused silica emitter operating at 1800° K., as is shown in FIG. 11. The envelope curve in FIG. 11 derives from our emitter spectral measurements. In FIG. 11, the black region represents the energy transmitted to the cell, and the light region represents the energy reflected back to the emitter, effectively allowing a higher emitter temperature. Only the gray region represents lost energy. Quantitative calculation shows that the black region represents 7.9 Watts/cm$^2$ and the gray region represents 1.9 Watts/cm$^2$. Of the 7.9 Watts/cm$^2$ received by the cells, 3.1 Watts/cm$^2$ should be converted to electricity. The TPV receiver efficiency should therefore be 3.1/(7.9+1.9)=32%.

Figure 12:
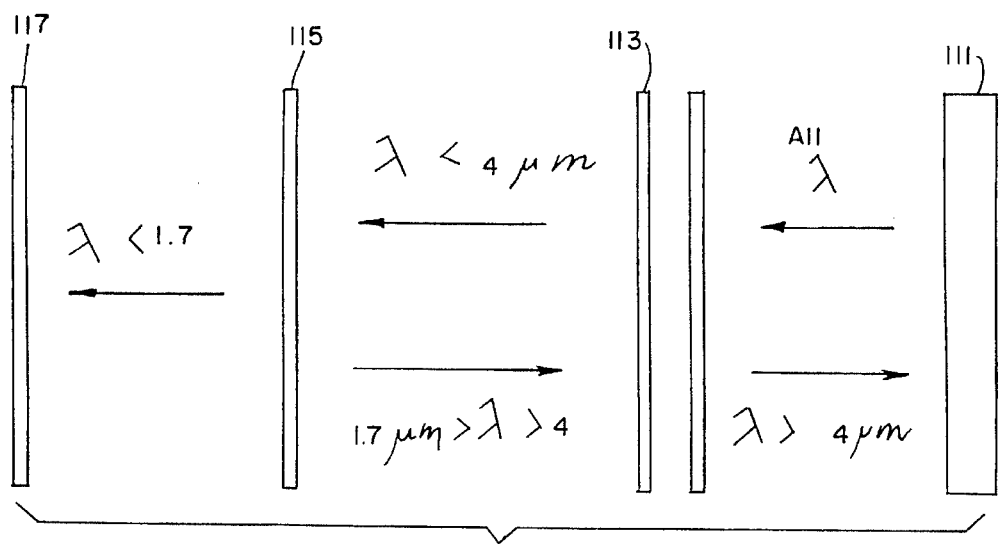
FIG. 12 shows the four essential infrared energy control elements of the efficient thermophotovoltaic generator: a blackbody emitter, fused silica heat shields, a dielectric filter, and low bandgap photovoltaic cells.

The essential components for infrared energy control in the present efficient thermophotovoltaic generator are shown in FIG. 12. A blackbody emitter 111 radiates energy over all wavelengths. Fused silica heat shields 113 then absorb energy in wavelengths longer than 4 microns and return a large fraction of this energy back to the emitter 111. Infrared energy in wavelengths shorter than 4 microns is transmitted through the fused silica 113. A dielectric filter 115 then reflects the energy in the wavelength range between the absorption edge of a TPV cell 117 and 4 microns back to the emitter 111. In the case of a GaSb TPV cell, the absorption edge wavelength is 1.7 microns.

In a preferred embodiment of this system, a silicon carbide blackbody emitter is surrounded by two fused silica heat shields and a simple dielectric filter array is attached to a GaSb TPV cell array which is then pointed at the emitter. In this case, assuming that the emitter temperature is 1475° C. and that the TPV cells are cooled so that they operate below 100° C. and that the fused silica heat shields are in radiation equilibrium with the emitter and the cell array, the temperatures of the inner and outer silica heat shields will be 1030° C. and 660° C., respectively, and that 67% of the emitter radiated energy with wavelengths longer than 4 microns will be returned to the emitter by the silica heat shields.

The present invention provides a generator having a modular construction with stacked similar elements which form the exchanger chambers and emitters arranged for low pressure drop operation.

While the invention has been described with reference to specific embodiments, modifications and variations of the invention may be constructed without departing from the scope of the invention, which is defined in the following claims.

I claim:

1. A thermophotovoltaic generator comprising a first heat exchanger having a first end and a second end, a second, ceramic heat exchanger having a second end and having a first end connected to the second end of the first heat exchanger, a combustion chamber connected to the second end of the second heat exchanger, an air supply connected to the first heat exchanger and connected through the second, ceramic heat exchanger for supplying air to the combustion chamber, a fuel supply connected to the first heat exchanger and connected through the second heat exchanger for supplying fuel to the combustion chamber, a stacked element infrared emitter connected to the combustion chamber for receiving hot combustion gases from the combustion chamber, at least one tube surrounding the emitter, thermophotovoltaic cells positioned around the emitter outside of the tube, filters fitted with the cells and an igniter extending in the combustion chamber.

2. The apparatus of claim 1, wherein the stacked element emitter further comprises multiple spaced discs having outer walls stacked to form a column, each disc having multiple holes.

3. The apparatus of claim 2, wherein each disc has a central hole for receiving an igniter insulator tube and an array of holes surrounding the central hole.

4. The apparatus of claim 3, wherein each disc is rotated a set degree relative to adjacent top and bottom discs to optimize infrared intensity uniformity.

5. The apparatus of claim 3, wherein the array is a hexagonal array of six holes.

6. The apparatus of claim 5, wherein each disc is rotated 30 degrees relative to adjacent top and bottom discs.

7. The apparatus of claim 2, wherein the discs are cup-shaped discs, each disc having an axial wall and a transverse plate having holes.

8. The apparatus of claim 7, wherein each disc has interfitting steps for receiving cylindrical projections in opposite ends of the discs.

9. The apparatus of claim 1, wherein the second, ceramic heat exchanger is a stacked ceramic disc heat exchanger having multiple discs having multiple holes and spacers stacked to form a column.

10. The apparatus of claim 9, wherein each disc has a central hole, an inner array of holes surrounding the central hole, and an outer array of holes surrounding the inner array of holes.

11. The apparatus of claim 10, wherein each disc is rotated a set degree relative to adjacent top and bottom discs to optimize infrared intensity uniformity.

12. The apparatus of claim 10, wherein the inner array has six evenly spaced holes and the outer array has six evenly spaced holes.

13. The apparatus of claim 12, wherein each disc is rotated 30 degrees relative to adjacent top and bottom discs.

14. The apparatus of claim 9, wherein the ceramic heat exchanger discs are cup-shaped and have outward extending flanges and an outer axial wall.

15. The apparatus of claim 1, further comprising a mixing chamber at the second end of the second, ceramic heat exchanger for mixing air and fuel.

16. The apparatus of claim 15, wherein the first heat exchanger, the second, ceramic heat exchanger, the mixing chamber and the combustion chamber have cylindrical walls, each wall having chamfered upper edges and complementary sloped, recessed lower edges for joining the walls in mutually supporting and gas sealing manners.

17. The apparatus of claim 1, wherein the at least one tube is selected from the group of tubes consisting of transparent fused silica tubes and SiC emitter tubes.

18. The apparatus of claim 1, wherein the filters are bonded directly to the thermophotovoltaic cells.

19. The apparatus of claim 1, wherein the filters are dielectric filters.

20. The apparatus of claim 19, wherein the dielectric filters comprise alternating layers of high and low index materials.

21. The apparatus of claim 1, wherein the thermophotovoltaic cells are GaSb cells and the infrared emitter is a SiC blackbody emitter operating in the 1700 to 2000 K. temperature range.

22. The apparatus of claim 1, wherein the tube is a single fused silica tube that surrounds the emitter and acts as a heat shield.

23. The apparatus of claim 1, wherein the emitter is surrounded by a first fused silica tube and a second fused silica tube, the first tube serving to confine exhaust gases and the second tube serving as a convection barrier.

24. The apparatus of claim 1, further comprising cooling fins positioned near the thermophotovoltaic cells for cooling the cells.

25. A thermophotovoltaic generator comprising a stainless steel heat exchanger for preheating air as the air circulates through the exchanger, the air being preheated by counter-flow exhaust gas, a first port positioned on the heat exchanger for receiving the air, an exit port positioned on the heat exchanger for releasing the exhaust gas, a ceramic spine disc heat exchanger connected to the stainless steel heat exchanger for receiving preheated air from the stainless steel heat exchanger, for further heating the air and for mixing the heated air with fuel in a lower end of the ceramic heat exchanger to create a fuel/air mixture, the ceramic spine disc heat exchanger having multiple spine exchanger discs stacked to form a column, with each exchanger disc having a central hole, a first array of holes surrounding the central hole, and a second array of holes surrounding the first array of holes, a fuel tube extending through the stainless steel heat exchanger and ending in the ceramic heat exchanger for delivering fuel to the lower end of the ceramic heat exchanger, a combustion chamber for receiving the fuel/air mixture and for generating hot combustion gases, an igniter extending in the combustion chamber for combusting the fuel/air mixture, an infrared radiation spine disc emitter forming a first down passage for receiving hot combustion gases, the emitter having multiple emitter discs stacked to form an emitter column, with each emitter disc having a central hole and a single array of holes surrounding the central hole, at least one fused silica tube surrounding the emitter forming therebetween an upward passage for the hot combustion gases, thermophotovoltaic cells positioned around the tubes that surround the emitter for receiving a fraction of infrared radiation emitted by the emitter and for converting the infrared radiation to DC electric power, and dielectric infrared radiation filters fitted between the emitter and the cells for transmitting infrared radiation of particular wavelengths.

26. The apparatus of claim 25, wherein a temperature of the air at a lower end of the stainless steel heat exchanger is below 900° C.

27. The apparatus of claim 25, wherein the filters transmit infrared radiation having wavelengths less than 1.7 microns or greater than 4.0 microns, and wherein the filters reflect infrared radiation having wavelengths between 1.7 and 4.0 microns.

28. The apparatus of claim 25, wherein each dielectric filter is a multiple layer dielectric filter having alternating layers of high and low index materials, wherein the filters reflect infrared radiation having wavelengths between 1.7 microns and 4.0 microns, and wherein the thermophotovoltaic cells are GaSb cells.

29. The apparatus of claim 25, wherein the cells are GaSb cells, wherein the emitter is an SiC emitter operating in a temperature range between 1700° K. and 2000° K., and wherein the fused silica tube surrounding the emitter functions as a heat shield and returns at least half of the energy received from the emitter that has wavelengths greater than 4.0 microns back to the emitter.

30. The apparatus of claim 25, further comprising cooling fins positioned near the cells for cooling the cells.

31. The apparatus of claim 25, wherein each emitter disc is positioned at a set degree of rotation relative to adjacent top and bottom emitter discs, and wherein each exchanger disc is positioned at a set degree of rotation relative to adjacent top and bottom exchanger discs.

32. A thermophotovoltaic generator comprising a central blackbody emitter operating at a temperature between 1400° C. and 1700° C. and surrounded by at least one fused silica heat shield, an array of low bandgap photovoltaic cells sensitive to wavelengths at least as long as 1.7 microns surrounding an outermost fused silica heat shield of the at least one fused silica heat shield and pointing inward towards the emitter, and a multilayer dielectric filter array located between the outermost fused silica heat shield and the array of low bandgap photovoltaic cells, the multilayer dielectric filter array transmitting wavelengths less than 1.7 microns to the low bandgap cells and reflecting wavelengths between 1.7 and 4 microns back to the blackbody emitter, wherein a temperature of the low bandgap cells is maintained below 100° C. by cooling and wherein the at least one fused silica heat shield is in radiation equilibrium with the emitter and the low bandgap cell array.

33. The thermophotovoltaic generator of claim 32, wherein the blackbody emitter is a SiC emitter.

34. The thermophotovoltaic generator of claim 32, wherein the low bandgap cells are GaSb cells.

35. The thermophotovoltaic generator of claim 32, wherein the multilayer filters are attached to the low bandgap cells.

* * * * *